United States Patent [19]
Lui et al.

[11] Patent Number: 5,698,466
[45] Date of Patent: Dec. 16, 1997

[54] TUNGSTEN TUNNEL-FREE PROCESS

[75] Inventors: Hon-Shung Lui; Ming-Chih Chung; Shun-Hsiang Chen, all of Hsin-Chu, Taiwan

[73] Assignee: Taiwan Semiconductor Manufacturing Company, Ltd., Hsin-Chu, Taiwan

[21] Appl. No.: 767,016

[22] Filed: Dec. 16, 1996

[51] Int. Cl.⁶ .................................. H01L 21/283
[52] U.S. Cl. ............... 437/192; 437/195; 437/228 S; 437/231
[58] Field of Search .................... 437/189, 190, 437/192, 195, 203, 231, 240, 238, 228 S; 257/751, 760

[56] References Cited

U.S. PATENT DOCUMENTS

| | | | |
|---|---|---|---|
| 4,753,709 | 6/1988 | Welch et al. | 156/643 |
| 4,764,484 | 8/1988 | Mo | 437/203 |
| 4,822,753 | 4/1989 | Pintchovski et al. | 437/192 |
| 5,008,730 | 4/1991 | Huang et al. | |
| 5,286,675 | 2/1994 | Chen et al. | 437/195 |
| 5,296,400 | 3/1994 | Park et al. | 437/52 |
| 5,340,774 | 8/1994 | Yen | 437/240 |

OTHER PUBLICATIONS

Broadbent, E., et al., "High Density High–Reliability Tungsten . . . ", IEEE Trans. Elec. Dev., vol. 35, No. 7, Jul. 1988, pp. 952–956.
"Method of Anchoring Contact or Via Plugs . . . ", IBM Tech. Disc. Bull., vol. 38, No. 6, Jun. 1995, pp. 405–407.

*Primary Examiner*—T. N. Quach
*Attorney, Agent, or Firm*—George O. Saile; Stephen B. Ackerman; Rosemary L. S. Pike

[57] ABSTRACT

A method of forming a tunnel-free tungsten plug is described. Semiconductor device structures are provided in and on a semiconductor substrate. An insulating layer of borophospho-tetraethoxysilane (BP-TEOS) is deposited overlying the semiconductor device structures. Contact openings are etched through the insulating layer to the underlying semiconductor device structures wherein a tunnel opens in the insulating layer between contact openings. The semiconductor substrate is covered with a first barrier metal layer. The semiconductor substrate is coated with a spin-on-glass layer wherein the contact openings and the tunnel are filled with the spin-on-glass. The spin-on-glass is anisotropically etched away whereby the spin-on-glass remains only within the tunnel. The semiconductor substrate is covered with a second barrier metal layer. The contact openings are filled with tungsten which is etched back to form tungsten plugs within the contact openings wherein the filled tunnel provides tunnel-free tungsten plugs in the fabrication of the integrated circuit device.

18 Claims, 3 Drawing Sheets

TUNGSTEN TUNNEL-FREE PROCESS

BACKGROUND OF THE INVENTION

(1) Field of the Invention

The present invention relates to the fabrication of integrated circuit devices, and more particularly, to a method of avoiding a tungsten tunnel due to BP-TEOS interlayer tunneling in the fabrication of integrated circuits.

(2) Description of the Prior Art

In the fabrication of integrated circuit devices, borophospho-tetraethoxysilane (BP-TEOS) is often used as an interlayer dielectric material. However, it is possible that a short could develop between contacts caused by abnormal BP-TEOS film. It has been found that a tunnel may open up in the BP-TEOS film between two contact openings, causing a short.

U.S. Pat. No. 5,296,400 to Park et al shows a method of forming a contact pad using borophosphosilicate glass (BPSG) or borophospho-tetraethoxysilane (BP-TEOS). U.S. Pat. No. 5,340,774 to Yen shows a method of planarization of BPSG or BPTEOS using an etch. Neither of these references mentions the problem of an interlayer tunnel.

SUMMARY OF THE INVENTION

Accordingly, it is a primary object of the present invention to provide a process for tungsten plug formation that is without an interlayer tunnel in the fabrication of integrated circuits.

It is a further object of the invention to provide a process for filling an interlayer tunnel in the process of tungsten plug formation.

Yet another object is to prevent a contact to contact short by filling an interlayer tunnel in a tungsten plug process.

In accordance with the objects of the invention, an improved method of forming a tunnel-free tungsten plug is achieved. Semiconductor device structures are provided in and on a semiconductor substrate. An insulating layer of borophospho-tetraethoxysilane (BP-TEOS) or the like is deposited overlying the semiconductor device structures. Contact openings are etched through the insulating layer to the underlying semiconductor device structures wherein a tunnel opens in the insulating layer between contact openings. The semiconductor substrate is covered with a first barrier metal layer. The semiconductor substrate is coated with a spin-on-glass layer wherein the contact openings and the tunnel are filled with the spin-on-glass material. The spin-on-glass material is anisotropically etched away whereby the spin-on-glass material remains only within the tunnel. The semiconductor substrate is covered with a second barrier metal layer. The contact openings are filled with tungsten which is etched back to form tungsten plugs within the contact openings wherein the filled tunnel provides tunnel-free tungsten plugs in the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
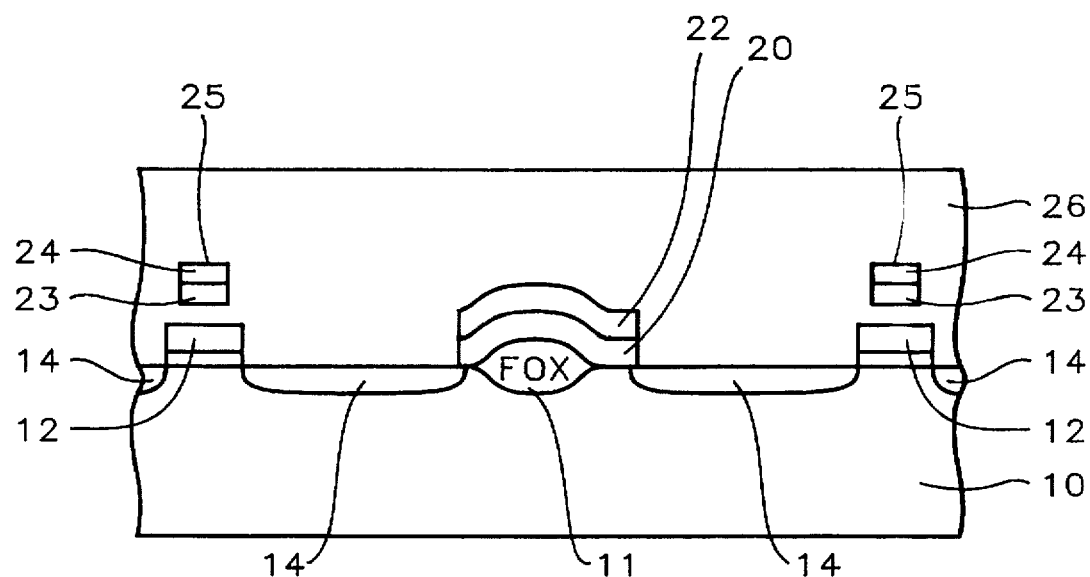
FIGS. 1 through 6 are cross-sectional representations of a preferred embodiment of the present invention.

Referring now more particularly to FIG. 1, there is shown a semiconductor substrate 10, in which may be formed semiconductor device structures which may include polysilicon gate electrodes 12 and source and drain regions 14. Active regions may be separated by Field OXide regions 11. Oxide 20 and undoped silicate glass 22 layers may be formed over the field oxide regions. Polycide word lines 25 may be formed as shown, consisting of a polysilicon layer 23 topped with a polycide layer 24.

A layer of borophospho-tetraethoxysilane (BP-TEOS) oxide 26 is deposited by atmospheric pressure chemical vapor deposition (APCVD) over the semiconductor device structures. Typically, this very thick layer 26 is deposited in a series of steps, such as a first layer having a thickness of about 4000 Angstroms, a second layer having a thickness of about 4000 Angstroms, and a third layer having a thickness of about 1000 Angstroms. The BP-TEOS is flowed and then etched back to planarize the substrate. Alternately, the insulating layer 26 could comprise borophosphosilicate glass (BPSG), phosphosilicate glass (PSG), or a combination of BPSG and silicon dioxide, etc, which are deposited in layers and reflowed, as described above. The layering leads to weakness in the insulating layer, especially between the first and second thick layers. This weakness or abnormality of the insulating film causes a tunnel to open up within the layer.

Figure 2:
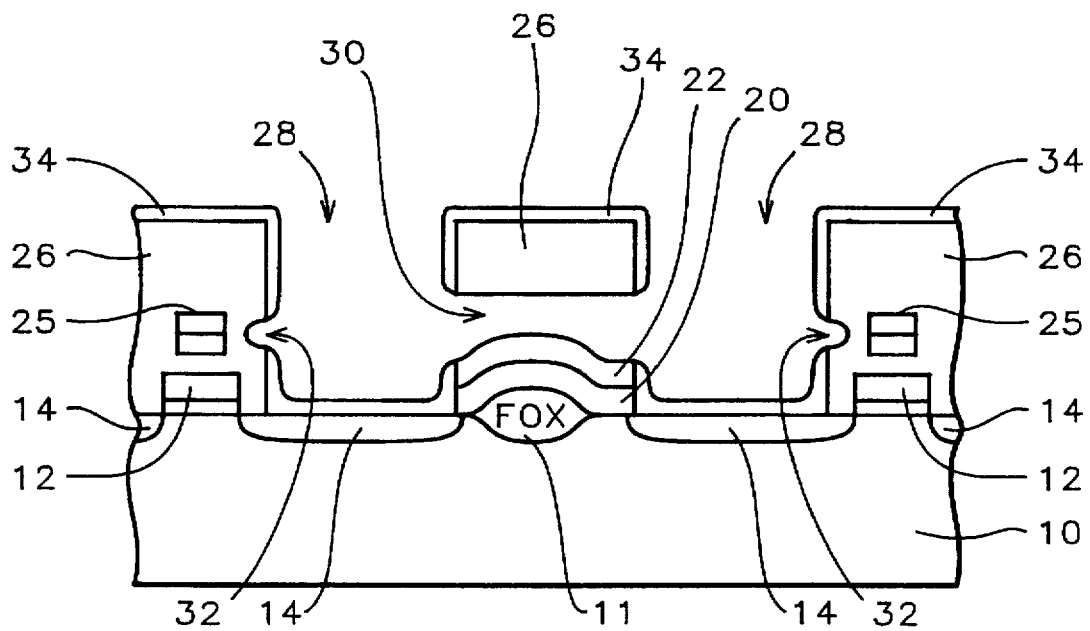

Referring now to FIG. 2, contact openings 28 are defined and etched through to the underlying semiconductor substrate where not covered by a mask. FIG. 2 illustrates the tunnel 30 that has opened up within the insulating layer 26. Notches 32 are also caused by the abnormal insulating layer film. If the tunnel 30 is allowed to remain open between the contact openings, it will cause a short between the two contacts. It is necessary to fill the tunnel in order to preserve the integrity of the electrical contacts.

The key tunnel-free process of the present invention will now be described. First, a barrier metal layer 34 is deposited over the surface of the BP-TEOS layer 26 and over the bottom and sidewalls of the contact openings. The barrier metal layer will protect the BP-TEOS or other insulating material from etching. The barrier metal layer may be formed by sputtering a layer of titanium followed by a layer of titanium nitride to a total thickness of between about 400 and 1000 Angstroms.

Figure 3:
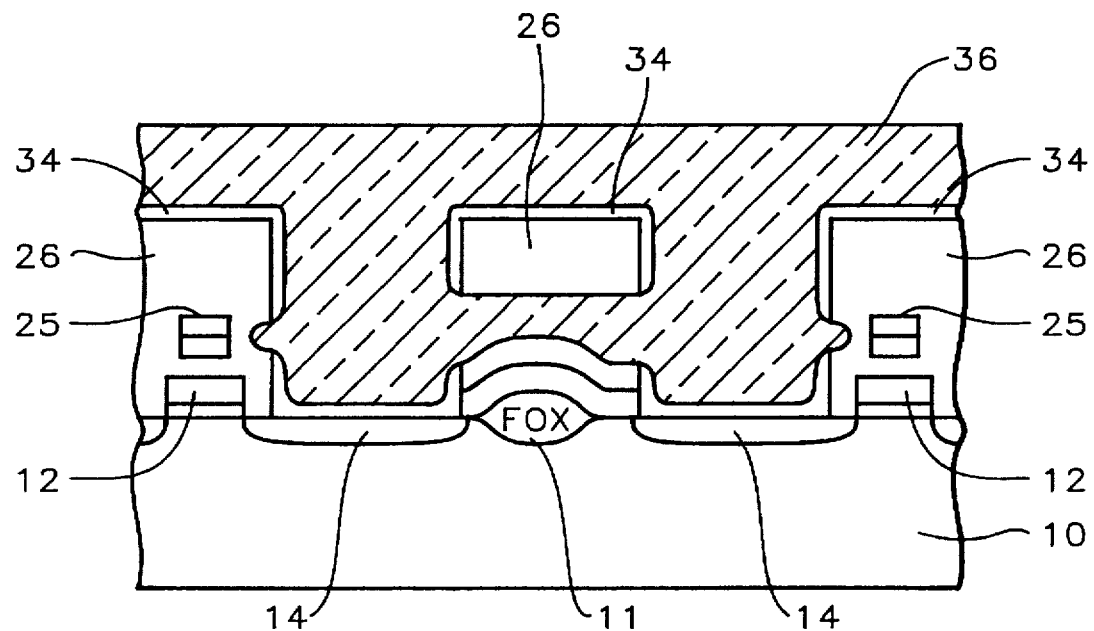

Referring now to FIG. 3, a layer of spin-on-glass 36 is coated over the substrate to a thickness of between about 2600 and 3600 Angstroms. The spin-on-glass material fills the contact openings and fills the tunnel 30. The spin-on-glass is baked and cured as is conventional in the art.

Figure 4:
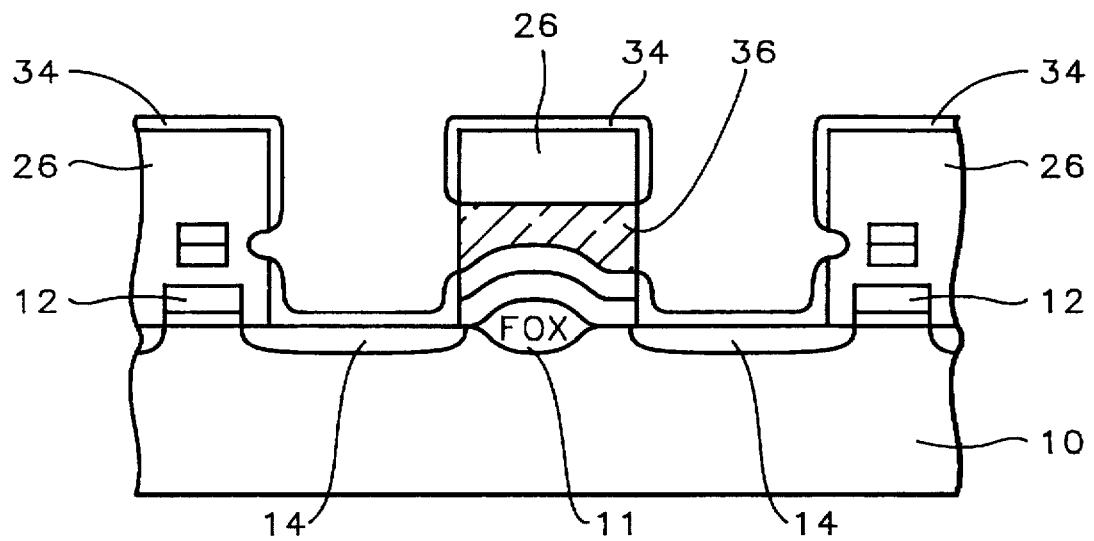

Next, the spin-on-glass material 36 is etched back using an anisotropic etch so that all the spin-on-glass material within the contact openings is removed. The spin-on-glass material remaining is only within the tunnel between the contacts, as illustrated in FIG. 4.

Figure 5:
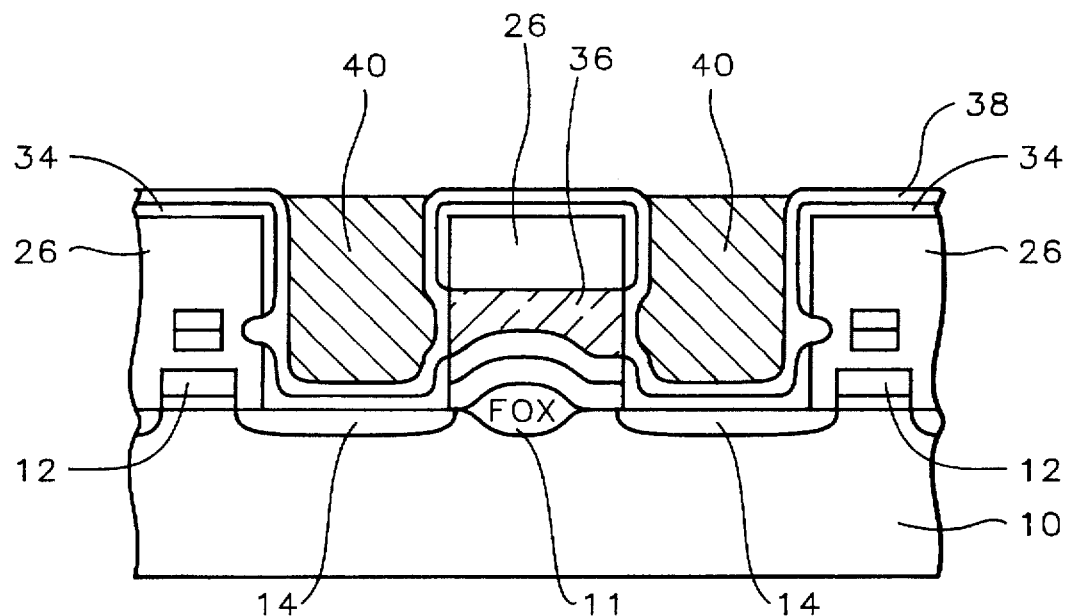

The substrate is cleaned, then a second barrier metal layer 38 is deposited over the substrate and within the contact openings, as shown in FIG. 5. This second barrier metal layer may comprise titanium/titanium nitride and is sputter deposited to a thickness of between about 500 and 1000 Angstroms. The layer 38 is required to cover the spin-on-glass material 36 on the sidewalls of the contact openings within the short region.

Next, tungsten is deposited and etched back to form tungsten plugs 40. A layer of aluminum or AlSiCu 42 is deposited and patterned to complete the electrical connections, as shown in FIG. 6.

Figure 6:
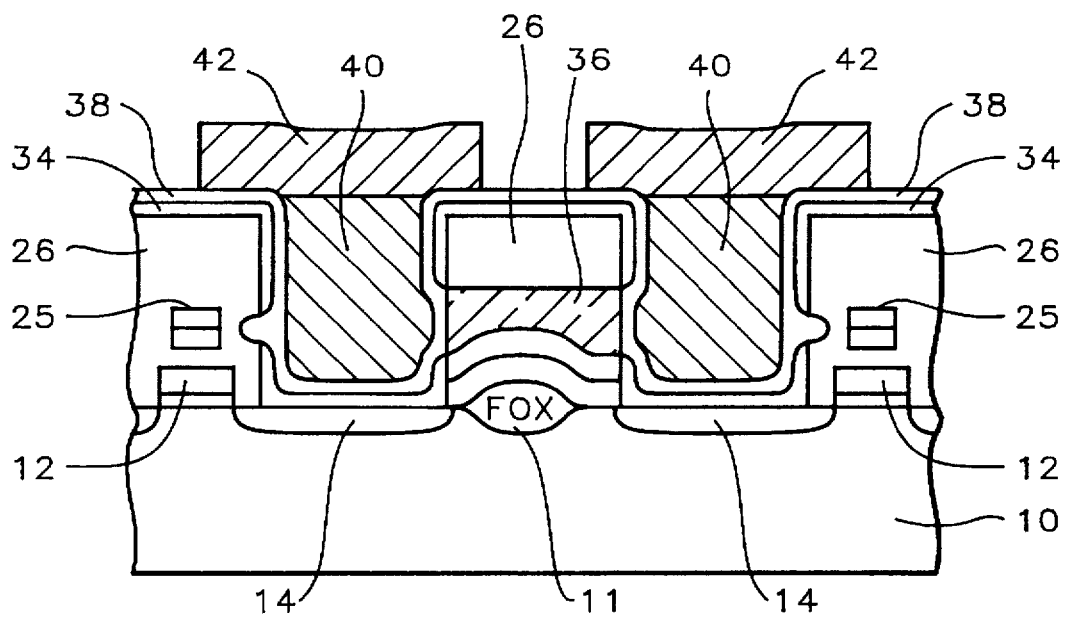

FIG. 6 illustrates a completed integrated circuit device fabricated by the process of the invention. Semiconductor device structures including gate electrodes 12 and source and drain regions 14 have been formed in and on the semiconductor substrate 10. Polycide word lines 25 have been formed above the gate electrodes 12. Tungsten plugs 40 through the thick insulating layer 26 and aluminum capping layer 42 form electrical connections with the source and drain regions 14. Spin-on-glass layer 36 fills the insulating layer tunnel between the tungsten plugs to prevent shorting of the contacts. Barrier layers 34 and 38 lie between the thick insulating layer and the tungsten plugs. The process of the invention provides an effective and very manufacturable method of preventing a contact to contact short caused by BP-TEOS or the like interlayer tunnelling. The tunnel which would cause a short is filled with a spin-on-glass material thereby preventing a short in the integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing an integrated circuit device comprising:

providing semiconductor device structures in and on a semiconductor substrate;

depositing an insulating layer overlying said semiconductor device structures;

etching contact openings through said insulating layer to underlying said semiconductor device structures wherein a tunnel opens in said insulating layer between said contact openings wherein said tunnel has openings in the sidewalls of said contact openings;

covering said semiconductor substrate and the surfaces of said contact openings with a first barrier metal layer;

coating said semiconductor substrate with a spin-on-glass material wherein said contact openings and said tunnel are filled with said spin-on-glass material;

anisotropically etching away said spin-on-glass material whereby said spin-on-glass material remains only within said tunnel;

covering said semiconductor substrate and the surfaces of said contact openings with a second barrier metal layer wherein said second barrier metal layer covers said spin-on-glass material on said sidewalls of said contact openings;

filling said contact openings with tungsten and etching back said tungsten to form tungsten plugs within said contact openings; and depositing a conducting layer overlying said tungsten plugs and said second barrier metal layer and patterning said conducting layer to complete the fabrication of said integrated circuit device.

2. The method according to claim 1 wherein said insulating layer comprises borophospho-tetraethoxysilane (BP-TEOS) having a thickness of between about 5000 and 9000 Angstroms.

3. The method according to claim 1 wherein said insulating layer comprises borophosphosilicate glass (BPSG) having a thickness of between about 5000 and 9000 Angstroms.

4. The method according to claim 1 wherein said insulating layer comprises phosphosilicate glass (PSG) having a thickness of between about 5000 and 9000 Angstroms.

5. The method according to claim 1 wherein said insulating layer comprises borophosphosilicate glass (BPSG) and silicon dioxide having a thickness of between about 5000 and 9000 Angstroms.

6. The method according to claim 1 wherein said first barrier metal layer comprises titanium/titanium nitride and has a thickness of between about 400 and 1000 Angstroms.

7. The method according to claim 1 wherein said spin-on-glass material is coated to a thickness of between about 2600 and 3600 Angstroms and wherein said spin-on-glass material is baked and cured.

8. The method according to claim 1 wherein said second barrier metal layer comprises titanium/titanium nitride and has a thickness of between about 500 and 1000 Angstroms.

9. The method according to claim 1 wherein said filling said tunnel prevents a short between said tungsten plugs.

10. A method of forming tunnel-free tungsten plugs in the fabrication of an integrated circuit device comprising:

providing semiconductor device structures in and on a semiconductor substrate;

depositing an insulating layer overlying said semiconductor device structures;

etching contact openings through said insulating layer to underlying said semiconductor device structures wherein a tunnel opens in said insulating layer between said contact openings;

covering said semiconductor substrate with a first barrier metal layer;

coating said semiconductor substrate with a spin-on-glass material wherein said contact openings and said tunnel are filled with said spin-on-glass material;

anisotropically etching away said spin-on-glass material whereby said spin-on-glass material remains only within said tunnel;

covering said semiconductor substrate with a second barrier metal layer; and filling said contact openings with tungsten and etching back said tungsten to form tungsten plugs within said contact openings wherein said filled tunnel provides tunnel-free tungsten plugs in the fabrication of said integrated circuit device.

11. The method according to claim 10 wherein said insulating layer comprises borophospho-tetraethoxysilane (BP-TEOS) having a thickness of between about 5000 and 9000 Angstroms.

12. The method according to claim 10 wherein said insulating layer comprises borophosphosilicate glass (BPSG) having a thickness of between about 5000 and 9000 Angstroms.

13. The method according to claim 10 wherein said insulating layer comprises phosphosilicate glass (PSG) having a thickness of between about 5000 and 9000 Angstroms.

14. The method according to claim 10 wherein said insulating layer comprises borophosphosilicate glass (BPSG) and silicon dioxide having a thickness of between about 5000 and 9000 Angstroms.

15. The method according to claim 10 wherein said first barrier metal layer comprises titanium/titanium nitride and has a thickness of between about 400 and 1000 Angstroms.

16. The method according to claim 10 wherein said spin-on-glass material is coated to a thickness of between about 2600 and 3600 Angstroms and wherein said spin-on-glass material is baked and cured.

17. The method according to claim 10 wherein said second barrier metal layer comprises titanium/titanium nitride and has a thickness of between about 500 and 1000 Angstroms.

18. The method according to claim 10 wherein said filling said tunnel prevents a short between said tungsten plugs.

* * * * *